United States Patent [19]

Kress

[11] 4,264,712

[45] Apr. 28, 1981

[54] METHOD OF HARDENING PHOTOPOLYMERIC PRINTING MATERIAL USING WARM AIR

[75] Inventor: David R. Kress, Rochester, N.Y.

[73] Assignee: Matrix Unlimited, Inc., Rochester, N.Y.

[21] Appl. No.: 79,044

[22] Filed: Sep. 26, 1979

[51] Int. Cl.³ .................... G03F 7/02; G03C 5/00; G03F 7/00

[52] U.S. Cl. .................... 430/302; 101/170; 427/273; 430/306; 430/307; 430/309; 430/322; 430/324; 430/330; 430/331

[58] Field of Search .............. 430/302, 306, 307, 309, 430/324, 322, 330, 331; 427/273; 101/170

[56] References Cited

U.S. PATENT DOCUMENTS

| | | |
|---|---|---|
| 3,512,971 | 5/1970 | Floss et al. .................... 430/306 |
| 3,516,828 | 6/1970 | Floss et al. .................... 430/306 |
| 3,586,504 | 6/1971 | Coates et al. .................... 430/322 |
| 3,661,660 | 5/1972 | Wessells et al. .................... 430/309 |
| 4,006,270 | 2/1977 | Morgan .................... 430/324 |
| 4,124,389 | 11/1978 | Hoornstra et al. .................... 430/330 |

OTHER PUBLICATIONS

"Curing Photo Resist . . . ", Karp, Intern. Soc. Hybrid Microwave Symposium, Beverly Hills, Cal. 1970.

Primary Examiner—Richard L. Schilling
Attorney, Agent, or Firm—Stonebraker, Shepard & Stephens

[57] ABSTRACT

Photopolymeric printing plates that have been imaged and etched are hardened by drying to remove surface moisture and are slowly and evenly heated while circulating warm air over the plate to prevent hot spots and remove vaporized material. Letter press type plates are heated up to 120° C. to 150° C., and intaglio type plates are heated to 200° C. to 220° C. Intaglio plates are also preferably coated with a thin layer of a fluorotelomer material before the heating is completed.

10 Claims, 2 Drawing Figures

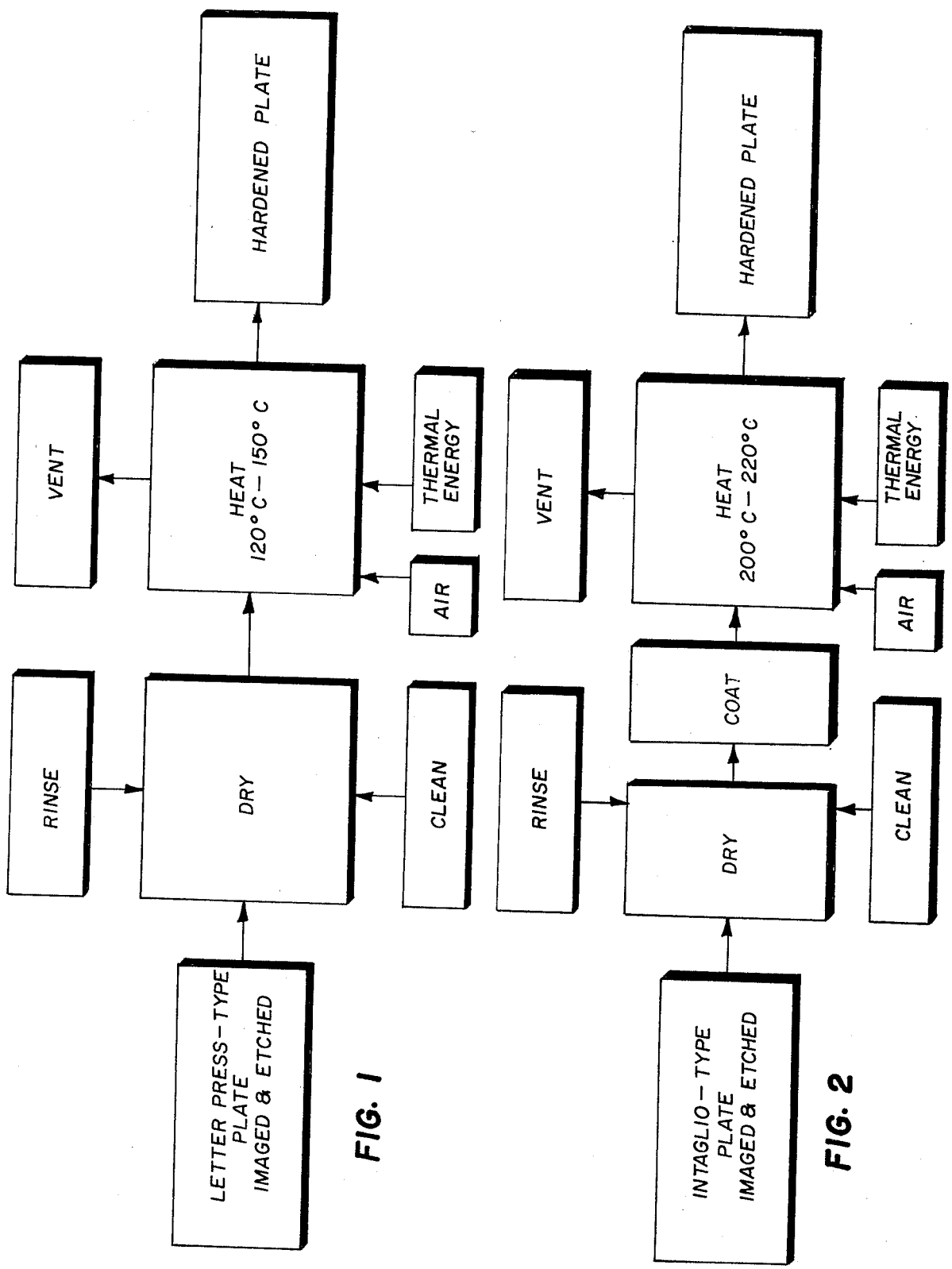

METHOD OF HARDENING PHOTOPOLYMERIC PRINTING MATERIAL USING WARM AIR

BACKGROUND OF THE INVENTION

Photopolymeric printing plates are widely used in the printing industry where they have many advantages but suffer from a well recognized disadvantage of being relatively soft. Their softness makes them easily scratched or dented, shortens their wear life on a press, and makes them unsuitable for some types of printing that, therefore require more expensive metal plates.

I have devised a way of hardening photopolymeric printing plates after they are imaged and etched so they are harder, tougher, more wear resistant, less easily damaged, and usable in applications that could not previously tolerate photopolymeric plates. My invention aims at simplicity and economy in making harder and tougher photopolymeric plates that can survive well in a wider variety of circumstances.

SUMMARY OF THE INVENTION

For hardening an imaged and etched photopolymeric printing plate of the letter press type, I dry the plate to remove surface moisture and slowly and evenly heat the plate up to 120° to 150° C. As the heating progresses, I circulate warm air over the plate to prevent hot spots and remove vaporized material. The drying step preferably includes rinsing the plate with a liquid that is hydrophilic and cleans etching residue from the plate.

For hardening an imaged and etched photopolymeric printing plate of the intaglio type, I also dry the plate to remove surface moisture and also preferably rinse with a liquid that is hydrophilic to remove surface moisture and is a solvent for removing etching residue from the surface of the plate. I heat and intaglio type plate slowly and evenly up to 200° to 220° C.; and either before the heating begins or before the heating is completed, I coat the plate with a thin layer of a fluorotelomer material that bonds securely to the plate surface.

Plates hardened by my invention are darker in color, much harder than untreated plates, have a better surface finish, and accomplish higher quality printing for a longer working life.

DRAWINGS

FIG. 1 is a schematic diagram of preferred steps in my process for hardening a letter press type photopolymeric plate; and FIG. 2 is a schematic diagram of preferred steps in my inventive process for hardening an intaglio type photopolymeric plate.

DETAILED DESCRIPTION

My invention hardens and toughens photopolymeric printing plates of the type that are presently available commercially. The most successful and commercially dominant photopolymeric printing plates are now made by BASF Wyandotte Corporation and sold under the brand name, NYLOPRINT. So far as I can determine, these plates are made according to U. S. Pat. Nos. 3,512,971 and 3,516,828. My invention successfully hardens the BASF plates that are presently sold, but it may also work with other photopolymeric printing plates.

Photopolymeric printing plates can be formed as letter press type plates with raised or relief impression areas around which the polymer is etched away. Letter press type plates can include half-tone images and can have a fine and detailed structure. Photopolymeric plates can also be used for gravure or intaglio type printing with the areas to be imprinted being etched into the surface of the plate as tiny cells. An intaglio plate is covered with ink, and the excess is wiped away by a doctor blade, leaving only the etched cells filled with ink for printing on the paper. Intaglio allows greater accuracy and detail. Both letter press and intaglio plates can be either flat or cylindrically shaped. My invention successfully hardens either type of plate by using slightly different methods.

The initial steps of imaging and etching plates remain as known in the prior art. Ultraviolet light passing through a negative image polymerizes portions of the plate, and an etching fluid formed as a mixture of water and ethyl alcohol removes unpolymerized material to make the plate a positive of the negative image. This can be postexposed to ultraviolet light for further hardening the unetched material. The plate is wiped clean and dried either by exposure to ambient atmosphere for at least several hours or by baking at about 71° C. for two hours. The plate is then used on a press, although it is much softer than the hardened plates my invention produces.

Unhardened photopolymeric plates as presently prepared are soft enough so that they can be easily dented with a fingernail and are susceptible to scratching or denting by objects that plates contact. For example, a paper splice can put a permanent dent in a polymeric plate; and to avoid this, the press must be stopped before the splice reaches the plate, the splice cut out, and the paper rethreaded for a costly interruption. Polymeric plates do not wear well with abrasive metallic inks containing tiny metal particles. Also, polymeric plates have not achieved sufficient accuracy and wear life to be usable in high quality printing of the best magazines that now require metal plates.

Hardening of photopolymeric plates according to my invention solves all these problems and others, making the plates tough, hard to damage, and able to stand up to abrasive inks and generally endure for a long wear life.

I use heat to harden photopolymeric plates after they are imaged and etched, and I apply the heat in a way that does not damage the plate. Simply placing the plates in a hot oven destroys them, and successful heat hardening has several requirements.

Considering first letter press type plates, the etching process leaves the polymer remaining on the plates slightly swollen with moisture. This is most noticeable in slightly concave impression areas such as the upper surfaces of letters that should be flat. Moisture swelling the sides of letters between their printing surfaces and their .029 inch depth to the supporting metal swells the polymer around the boundaries of the letters, making their tops slightly concave. Drying restores the letter tops to flatness, and drying occurs after many hours of exposure to air and can be speeded up by baking the plates at about 71° C. for two hours.

I have found a faster way of drying excess moisture from the plates to restore their imprinting areas to flatness, and my method also cleans away and removes thin collections of etching residue that are unavoidable from the etching process. I rinse the etched plates with a liquid that includes a solvent having residue cleaning capacity and a hydrophilic material that removes water from the plate surface. I prefer a mixture of acetone and pure ethyl alcohol at about equal volumes, although other materials and proportions are probably workable. For rinsing letter press plates, I increase the pure ethyl alcohol volume to about 60%, relative to about 40% acetone; and for rinsing intaglio plates, I increase the acetone volume to about 60%, relative to about 40% pure ethyl alcohol.

Although I am not certain about the operation of my rinse, apparently the pure ethyl alcohol takes up moisture from the plate surface, and the acetone cleans away and removes etching residue. I pump the rinsing liquid through a circuit that sprays over and washes the plate, collects in a sump, and filters through a granular, hydrophilic material that removes water from the rinsing liquid. I prefer sodium sulfate for this, but other materials would probably work. The rinsing step both cleans the plate and removes moisture to restore its printing areas to flatness, and it allows heat hardening to proceed without damaging the plate.

The next step for letter press plates is heat hardening, which must be done slowly and evenly. I prefer an oven that circulates air over the plates as they are heated so that the moving air eliminates hot spots and prevents any local overheating. This allows the temperature to be slowly and evenly increased for gently driving off volatile materials remaining in the polymer without cracking, pocking, or otherwise damaging the plate surface. The moving air also entrains and vents away volatile materials driven out of the plate polymer during the heating step. Although only a small amount of venting is required, it is important to give the plate a relatively fresh air atmosphere to receive vapors and maintain uniform temperature.

For letter press type photopolymeric plates, I begin the heating step at about 75° C. and increase it by about 15° C. every fifteen minutes until the temperature reaches 120° to 150° C. The final temperature depends on the use planned for the plate. For crash imprinting of multiple copies, I heat to 120° to 140° C.; and for single copy impressions, I heat to 150° C. Higher final temperatures make the plate harder and more brittle; and overheating risks fracturing the polymer and breaking it loose from its metallic support, especially during stressful printing operations such as crash imprinting. Lower temperatures make the plate slightly less hard and tougher so as to better withstand shock.

Letter press plates hardened by my method are not damaged by splices; are resistant to abrasive inks; are tough, durable, and not easily scratched or dented; and wear longer on the press so that they are in increasing demand, even though they sell at a premium, For intaglio type photopolymeric plates, I heat to a higher temperature and coat the surface with a thin layer of a fluorotelomer. Intaglio type plates for gravure printing can achieve high accuracy and fine detail, if their surfaces are accurately smooth and flat and their etched cells are clearly defined and accurate. Etching residue remaining on an intaglio plate impairs accuracy, and its removal is important. As previously explained, I increase the proportion of acetone to about 60% relative to pure ethyl alcohol at about 40% in my preferred rinsing liquid for intaglio plates to insure that etching residue is thoroughly removed as the surface moisture is taken up. I also rotate the plates in 90° steps in the rinsing bath to wash the rinsing liquid over the plates in four different directions to clean shoulders and cell wall surfaces from four different angles. Agitation and mechanical scrubbing are also possible. A blow dry following my rinsing step leaves intaglio plates dry and clean with residue-free surfaces having an excellent finish.

I prefer coating intaglio type photopolymeric plates with a thin layer of a fluorotelomer that gives a smooth surface finish with a low friction for wearing well against a doctor blade. A fluorotelomer that I prefer for this is marketed by DuPont under the brand name, VYDAX 550, as a dispersion of a white, waxy, short-chain telomer of tetrafluoroethylene in a trichlorotrifluoroethane solvent. It provides a low coefficient of friction and high lubricity on the plate surface and affords excellent release or antistick properties. It also bonds securely to the polymer of the plate during the heating process. I apply the fluorotelomer coating before the heating is completed so that heat bonds the coating to the polymer of the plate; and as shown schematically in FIG. 2, the fluorotelomer coating can be applied before the heating begins.

Intaglio type plates retain a much larger amount of polymer on the finished plate and are solid polymer with etched recesses for printing so that brittleness or breaking away from the supporting metal layer is not a problem. These plates can be hardened even more by heating to a higher temperature of 200° to 220° C. Again, the heating proceeds slowly and uniformly in gradual stages increased by a few degrees every few minutes as explained for letter press plates until the final temperature is reached. Above 150° C., I advance the heating rate to increase about 25° C. every fifteen minutes. Also, the heating occurs in the presence of circulated air that prevents hot spots and vents away material that is vaporized out of the plates during heating.

The hardened intaglio plates that result from my process are tough, durable, and highly accurate so they can be used for printing that was previously not possible with photopolymeric plates. This includes precious document printing such as checks, travelers checks, stock certificates, etc. requiring detail such as was previously accomplished with handmade engravings. My hardened intaglio plates can be used as dyes for making molded polymeric relief plates, and unhardened polymeric plates cannot withstand the heat and pressure required for such molding. Gravure plates hardened according to my invention have been highly successful at precious document printing and might even succeed for printing money.

The heat used in hardening plates according to my invention darkens the plates and apparently carbonizes some of the material in the plates. When heating is gradual and uniform after cleaning and drying and in the presence of circulated air as I prefer, the heating does not damage the plate surface; and it greatly increases the hardness of the plates without impairing their accuracy. Apparently, heat removal of vaporizable materials eliminates barriers or obstructions to cross linking of the plate polymer; and the energy supplied by the heat enhances polymeric linkages to substantially increase the hardness of the plate.

Workers skilled in the art will recognize substitutions and refinements that can be made in hardening photopolymeric plates with heat, once they understand the basic principles of my invention and know that significant and advantageous hardening is possible.

I claim:

1. A method of hardening an imaged and etched photopolymeric printing plate of the letter press type, said method comprising:

a. rinsing said plate with a liquid material that is hydrophilic and cleans etching residue from said plate;
b. drying said plate to remove surface moisture;
c. slowly and evenly heating said plate up to 120° to 150° C.; and
d. circulating warm air over said plate during said heating step to prevent hot spots and remove vaporized material.

2. The method of claim 1 wherein said liquid material includes acetone and ethyl alcohol.

3. The method of claim 1 wherein said heating is increased in timed stages.

4. A method of hardening an imaged and etched photopolymeric printing plate of the intaglio type, said method comprising:
a. drying said plate to remove surface moisture;
b. slowly and evenly heating said plate up to 200° to 220° C.;
c. circulating warm air over said plate during said heating step to prevent hot spots and remove vaporized material; and
d. before said plate is heated to said 200° to 220° C., coating said plate with a thin layer of a fluorotelomer material.

5. The method of claim 4 wherein said drying step includes rinsing said plate with a hydrophilic liquid.

6. The method of claim 4 including rinsing said plate with a cleaning material for removing etching residue before said heating step.

7. The method of claim 6 wherein said cleaning material includes acetone.

8. The method of claim 4 wherein said drying step includes rinsing said plate with a liquid material that is hydrophilic and cleans etching residue from said plate.

9. The method of claim 8 wherein said liquid material includes acetone and ethyl alcohol.

10. The method of claim 4 wherein said heating is increased in timed stages.

* * * * *